United States Patent
Cheng et al.

(10) Patent No.: US 8,347,188 B2
(45) Date of Patent: Jan. 1, 2013

(54) ERROR CORRECTION METHODS AND APPARATUS FOR MOBILE BROADCAST SERVICES

(75) Inventors: Jian Cheng, Shanghai (CN); Datong Chen, Fremont, CA (US); Jingdong Lin, Irvine, CA (US); Yi Kang, Fremont, CA (US)

(73) Assignee: Spreadtrum Communication (Shanghai) Co. Ltd., Shanghai (CN)

( * ) Notice: Subject to any disclaimer, the term of this patent is extended or adjusted under 35 U.S.C. 154(b) by 1219 days.

(21) Appl. No.: 12/038,651

(22) Filed: Feb. 27, 2008

(65) Prior Publication Data

US 2008/0222485 A1    Sep. 11, 2008

(30) Foreign Application Priority Data

Feb. 27, 2007    (CN) .......................... 2007 1 0037700

(51) Int. Cl.
*H03M 13/00*    (2006.01)

(52) U.S. Cl. ......... 714/776; 714/761; 714/762; 714/784

(58) Field of Classification Search .................. 714/761, 714/762, 776, 784
See application file for complete search history.

(56) References Cited

U.S. PATENT DOCUMENTS

| | | | | |
|---|---|---|---|---|
| 4,547,887 A * | 10/1985 | Mui | ............................. | 375/285 |
| 5,457,712 A * | 10/1995 | Weerackody | .................. | 375/347 |
| 5,887,005 A * | 3/1999 | Sharma | ......................... | 714/784 |
| 6,055,277 A * | 4/2000 | Stephens et al. | ............... | 375/285 |
| 6,397,367 B1 * | 5/2002 | Park et al. | ...................... | 714/786 |
| 6,650,374 B2 * | 11/2003 | Choi et al. | ..................... | 348/723 |
| 6,681,362 B1 * | 1/2004 | Abbott et al. | .................. | 714/755 |
| 6,958,781 B2 * | 10/2005 | Fimoff | .......................... | 348/555 |
| 6,996,133 B2 * | 2/2006 | Bretl et al. | ...................... | 370/535 |
| 7,215,714 B2 * | 5/2007 | Bretl et al. | ...................... | 375/262 |
| 7,474,702 B2 * | 1/2009 | Choi et al. | ............... | 375/240.27 |
| 7,474,703 B2 * | 1/2009 | Choi et al. | ............... | 375/240.27 |
| 7,558,297 B2 * | 7/2009 | Bretl et al. | ...................... | 370/535 |
| 7,593,474 B2 * | 9/2009 | Jeong et al. | ..................... | 375/265 |
| 7,706,449 B2 * | 4/2010 | Choi et al. | ............... | 375/240.27 |
| 7,742,530 B2 * | 6/2010 | Choi et al. | ............... | 375/240.27 |
| 7,975,204 B2 * | 7/2011 | Bretl et al. | ...................... | 714/755 |
| 2008/0089415 A1* | 4/2008 | Bretl et al. | ............... | 375/240.13 |

* cited by examiner

*Primary Examiner* — Joseph D Torres

(57) ABSTRACT

An apparatus and method of an outer Forward Error Correcting (FEC) code for a mobile broadcast service based on TD-SCDMA network is disclosed.

4 Claims, 3 Drawing Sheets

ERROR CORRECTION METHODS AND APPARATUS FOR MOBILE BROADCAST SERVICES

CROSS-REFERENCE TO RELATED APPLICATION(S)

This application claims priority to Chinese Patent Application No. 200710037700.8, filed Feb. 27, 2007, the disclosure of which is incorporated herein by reference in its entirety.

TECHNICAL FIELD

The invention is related to error correction methods and apparatus for mobile services. In particular, the present invention is related to error correction methods and apparatus for, e.g., mobile TV broadcast services based on a TD-SCDMA network.

BACKGROUND

The 3rd generation mobile communication standards include FDD, TDD HCR and TDD LCR. Among these standards, FDD is also called WCDMA, and TDD LCR is typically called TD-SCDMA. TD-SCDMA is the Chinese $3^{rd}$ generation mobile communication standard. The features of this standard focus on Smart Antenna, Dynamic Channel Allocation, unsymmetrical resource configuration and Joint Detection. TD-SCDMA can be implemented in intra-frequency configuration. TD-SCDMA is also one type of code resource limited communication system with higher frequency efficiency over WCDMA.

The network configuration of TD-SCDMA can be in the form of inter-frequency network or intra-frequency network. The latter further includes 1.6 MHz intra-frequency networks and 5 MHz intra-frequency networks. The multiple accessing for neighboring cells is based on FDMA for inter-frequency configuration. The assigned frequency resources can be utilized for all Node-Bs in 1.6 MHz intra-frequency network, and the 1.6 MHz intra-frequency network configuration has the highest frequency efficiency with severe intra-frequency interference. 5 MHz intra-frequency configuration, based on N frequency point protocol, is a tradeoff of the inter-frequency and intra-frequency technology. In this configuration, the $0^{th}$ timeslot carries common control information, such as of PCCPCH/SCCPCH, is inter-frequency configured, while $1^{st}$ to $6^{th}$ timeslots are intra-frequency configured. Smart antenna and dynamic channel allocation may be used for intra-frequency configured TD-SCDMA system to decrease the strong intra-frequency interference.

DETAILED DESCRIPTION

Figure 1:
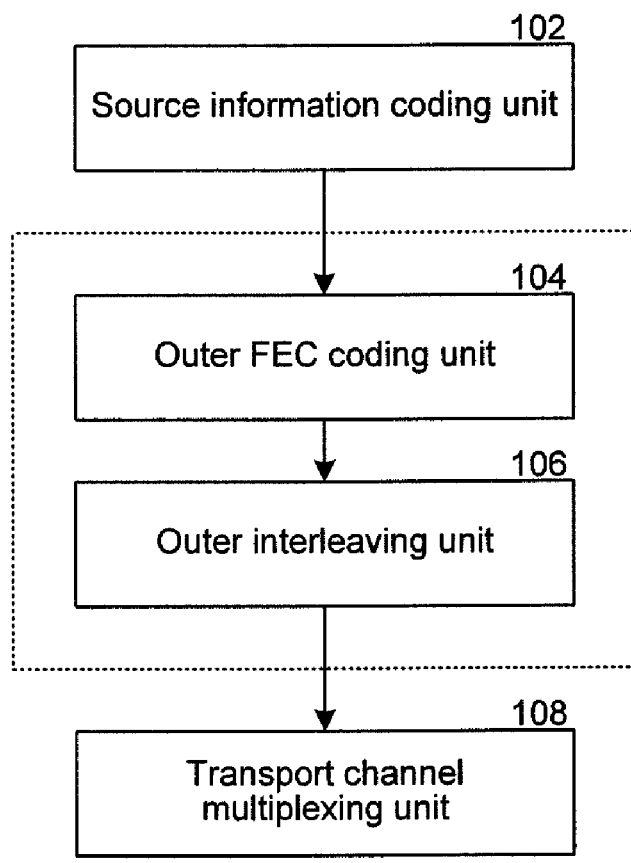
FIG. 1 is a schematic diagram of an outer FEC coding apparatus for a mobile broadcast service based on TD-SCDMA network in accordance to an embodiment of the invention.

The following disclosure describes several embodiments of methods and systems for error correction in an intercommunication system. Several details describing well-known structures or processes often associated with digital intercommunication systems are not set forth in the following description for purposes of brevity and clarity. Also, several other embodiments of the invention can have different configurations, components, or procedures than those described in this section. A person of ordinary skill in the art, therefore, will accordingly understand that the invention may have other embodiments with additional elements, or the invention may have other embodiments without several of the elements shown and described below with reference to FIGS. 1-3.

The terminology used in the description presented is intended to be interpreted in its broadest reasonable manner, even though it is being used in conjunction with a detailed description of certain specific embodiments of the invention. Certain terms may even be emphasized below; however, any terminology intended to be interpreted in any restricted manner will be overtly and specifically defined as such in this "Detailed Description" section.

INTRODUCTION

The network configuration described above is suitable for dedicated mobile user services such as speech and data. However, it may not be suitable for mobile broadcast services such as mobile TV. In order to support mobile broadcast services such as mobile TV based on TD-SCDMA, a single frequency network (SFN) can be overlaid on traditional mobile communication networks, namely TD-SCDMA communication networks. The SFN network can be overlapped on the TD-SCDMA network, in which some frequency resources and timeslot resources are reserved for single frequency transmission and receiving so that mobile broadcast services such as mobile TV can be supported. From the view of mobile communication, a TD-SCDMA network is still a traditional 3G mobile communication network, in which a location area, a registration area, and a routing area exist. At the same time, the TD-SCDMA network can also be a mobile broadcast network with distributed transmission, and the concept of location area, registration area, routing area, etc do not exist. The mobile user equipment would utilize all downlink transmission from all recognizable Node-Bs by diversity combining.

Generally speaking, the block error rate (BLER) of a mobile communication network is typically between $10^{-2}$ and $10^{-3}$, and a corresponding bit error rate (BER) is between $10^{-4}$ and $10^{-5}$. Such error rates are not suitable for mobile TV broadcast services, in which 264 or AVS standard is applied. In order to support mobile broadcast TV services, the BER needs to be decreased to between about $10^{-8}$ to about $10^{-9}$.

Several embodiments of the invention can achieve lower BER by inserting an extra outer FEC code for decreasing the system BER. One embodiment of an outer FEC coding unit for the mobile broadcast service based on TD-SCDMA network includes:

a source information coding unit configured to perform encoding of image and speech for a mobile broadcast service;

an outer FEC coding unit, which is connected to the source information coding unit, configured to perform the Reed-Solomon encoding of the information package for error correcting;

an outer interleaving unit, which is connected to the outer FEC coding unit, configured to perform interleaving of the RS encoded data and the continuous error bytes can be randomized;

a transport channel multiplexing unit, which is connected to the outer interleaving unit, performs transport channel data multiplexing and mapping to the physical channel. The outer FEC coding apparatus can be implemented in a server for a NodeB, a radio traffic controller, a network controller, and/or other TD-SCDMA network components.

In certain embodiments, the outer Forward Error Correcting coding unit above utilizes the Reed-Solomon (204, 188, t=8) code, which is shortened from the Reed-Solomon (255, 239, t=8) code. In other words, a transmission information package containing 188 bytes is encoded in the Reed-Solomon (204, 188, t=8) encoder to be a 204-byte encoded information package. In other embodiments, the outer interleaving unit performs data interleaving of the Reed-Solomon encoded data. In yet other embodiments, the interleaving algorithm of the outer interleaving unit can be convolutional interleaving or block interleaving.

In further embodiments, the parameters of the transport channel unit can be set to:
 the transport block size: 408 bits;
 the transport block number: 5, 6, 7 or 8;
 TFCI index: 0→5×408, 1→6×408, 2→6×408, 3→8×408;
 CRC check: 16 bits;
 channel coding type: ⅓ turbo encoding, the same as specified in 3GPP;
 physical channel resource: one timeslot, and 16 radio units (RUs) in the timeslot;
 puncture limit: 55%;
 TTI: 20 ms.

In other embodiments though, the parameters of the transport channel unit can also be set to:
 the transport block size: 204 bits;
 the transport block number: 10, 11, 12, 13, 14, 15 or 16;
 TFCI index: 0→10×204, 1→11×204, 2→12×204, 3→13×204, 4→14×204, 5→15×204, 6→16×204;
 CRC check: 0 bits;
 channel coding type: ⅓ turbo encoding, the same as specified in 3GPP;
 physical channel resource: one timeslot, and 16 radio units (RUs) in the timeslot;
 puncture limit: 55%;
 TTI: 80 ms.

Several embodiments of a method for an outer Forward Error Correcting coding for a mobile broadcast service based on TD-SCDMA network include:
 encoding source information, e.g., image and/or speech for the mobile broadcast service;
 encoding outer FEC, e.g., by performing the Reed-Solomon encoding of a information package for error correcting;
 outer interleaving including interleaving of the RS encoded data such that data bytes with errors can be randomized;
 multiplexing a transport channel including performing transport channel data multiplexing and mapping to the physical channel.

In certain embodiments of the method above, the Reed-Solomon (204, 188, t=8) code is utilized, which is shortened from the Reed-Solomon (255, 239, t=8) code. In other words, a transmission information package containing 188 bytes is encoded in the Reed-Solomon (204, 188, t=8) encoder to a 204-byte encoded information package. In other embodiments, the outer interleaving unit performs data interleaving of the Reed-Solomon encoded data. In yet other embodiments, the interleaving algorithm of the outer interleaving unit can be convolutional interleaving or block interleaving.

In further embodiments, the parameters of the transport channel unit can be set to:
 the transport block size: 408 bits;
 the transport block number: 5, 6, 7 or 8;
 TFCI index: 0→5×408, 1→6×408, 2→6×408, 3→8×408;
 CRC check: 16 bits;
 channel coding type: ⅓ turbo encoding, the same as specified in 3GPP;
 physical channel resource: one timeslot, and 16 radio units (RUs) in the timeslot;
 puncture limit: 55%;
 TTI: 20 ms.

In yet further embodiments, the parameters of the transport channel unit can also be set to:
 the transport block size: 204 bits;
 the transport block number: 10, 11, 12, 13, 14, 15 or 16;
 TFCI index: 0→10×204, 1→11×204, 2→12×204, 3→13×204, 4→14×204, 5→15×204, 6→16×204;
 CRC check: 0 bits;
 channel coding type: ⅓ turbo encoding, the same as specified in 3GPP;
 physical channel resource: one timeslot, and 16 radio units (RUs) in the timeslot;
 puncture limit: 55%;
 TTI: 80 ms.

Compared to the traditional technology, several embodiments of the invention described above can have the following effects: lower BER, which is needed for the mobile broadcast service, is achieved by the Reed-Solomon coding of the transmission information package, interleaving process to randomize the error pattern and multiplexing the coded and interleaved information to transmit on the physical channel.

EMBODIMENTS

FIG. 1 is a schematic diagram of an outer FEC coding apparatus for a mobile broadcast service based on TD-SCDMA network in accordance with an embodiment of the invention. In the illustrated embodiment, the apparatus includes: a source information coding unit 102, an outer FEC coding unit 104, an outer interleaving unit 106, and a transport channel multiplexing unit 108 interconnected with one another.

The source information coding unit 102 is configured to perform image encoding such as per 264 or AVS standard, or speech encoding such as per ACC plus standard for the mobile broadcast TV service. The outer FEC coding unit 104 is connected to the source information coding unit 102, and is configured to perform Reed-Solomon encoding of an information package for error correcting. The Reed-Solomon coding scheme is based on block encoding, which provides extra error-correcting compatibility and strengthens the transmission robustness of an error-burst channel. The outer the Reed-Solomon (204, 188, t=8) code is shortened from the Reed-Solomon (255, 239, t=8) code. In other words, a transmission information package containing 188 bytes is encoded in the Reed-Solomon (204, 188, t=8) encoder to a 204-byte encoded information package. The RS coded data block size is 204 bytes, and the data block size before RS coding is 188 bytes with 16 bytes of redundant check information bytes, which can correct at most 8 bytes error in one coded block. The code generating polynomial of the RS (255,239,t=8) is illustrated as $g(x)=(x+q^0)(x+q^1)(x+q^2)\ldots(x+q^{16})$, wherein q=2; the Galois field (GF) generating polynomial $p(x)=x^8+x^3+x^2+1$.

Figure 2:
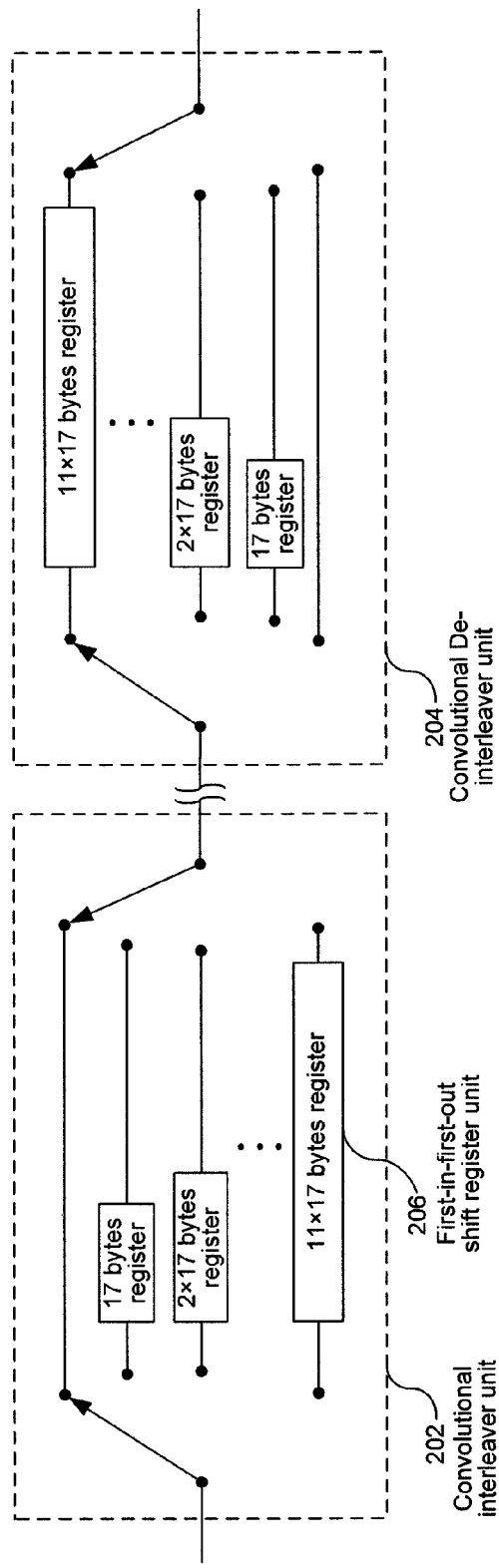
FIG. 2 is a component diagram of a convolutional interleaving and de-interleaving unit in accordance to an embodiment of the invention.

The outer interleaving unit 106 is connected to the outer FEC coding unit 104, and is configured to perform interleaving of the RS encoded data to randomize bytes with errors (hereinafter referred to as "error bytes"). The outer interleaving unit 106 can utilize the block interleaving or convolutional interleaving algorithm, and the convolutional interleaving unit randomizes the coded data for correcting error bytes and recovering the correct data. FIG. 2 illustrates a convolutional interleaving diagram showing the interleaving and de-interleaving process. The convolutional interleaver 202 is configured to perform the interleaving process, while convolutional de-interleaver realizes the de-interleaving of the received user data from TD-SCDMA network. As such, the continuous error caused by the non-ideal wireless channel is randomized. Convolutional interleaver 202 has a first-in-first-out shift register 206, and the first branch needs no register; the second branch needs a register with length of 17 bytes; the third branch needs a register with the length of 2×17 bytes, . . . , the $L^{th}$ branch needs a register with the length of (L−1)×17 bytes; while at the convolutional de-interleaver side, the $L^{th}$ branch needs no register, the $(L-1)^{th}$ needs a register with length of 17 bytes, the $(L-2)^{th}$ needs a register with length of 2×17 bytes, . . . , the first branch needs a register with the length of (L−1)×17 bytes. When L is set to 12 or 24, and the transmission speed is 160 kbps, the interleaving depth is 120 ms or 240 ms, respectively.

The transport channel multiplexing unit 108 is connected to the outer interleaving unit 106, where the RS coded and outer interleaved data is mapped to the physical channel and transmitted. Two examples of the transport channel multiplexing are present as follows.

Example One the transport block size: 408 bits;
the transport block number: 5, 6, 7 or 8;
TFCI index: 0→5×408, 1→6×408, 2→6×408, 3→8×408;
CRC check: 16 bits;
channel coding type: ⅓ turbo encoding, the same as specified in 3GPP;
physical channel resource: one timeslot, and 16 radio units (RUs) in the timeslot;
puncture limit: 55%;
TTI: 20 ms.

Example Two the transport block size: 204 bits;
the transport block number: 10, 11, 12, 13, 14, 15 or 16;
TFCI index: 0→10×204, 1→11×204, 2→12×204, 3→13×204, 4→14×204, 5→15×204, 6→16×204;
CRC check: 0 bits;
channel coding type: ⅓ turbo encoding, the same as specified in 3GPP;
physical channel resource: one timeslot, and 16 radio units (RUs) in the timeslot;
puncture limit: 55%;
TTI: 80 ms.

Figure 3:
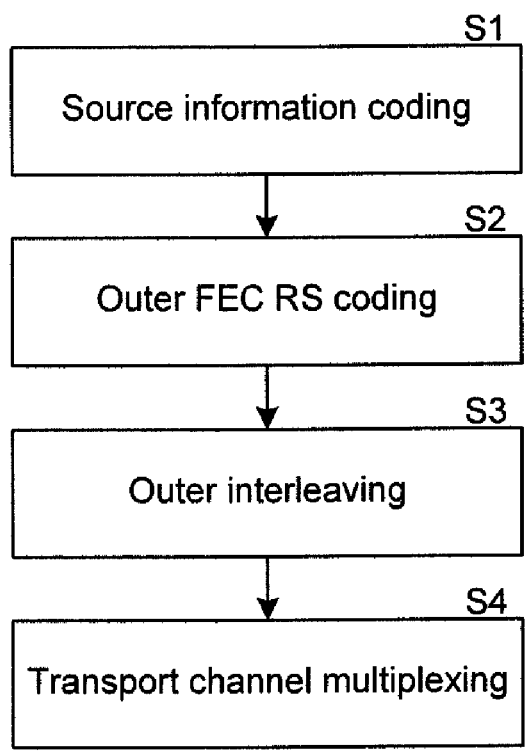
FIG. 3 is a flow chart of an outer FEC coding apparatus for a mobile broadcast service based on TD-SCDMA network in accordance to an embodiment of the invention.

Based on the above apparatus of the outer FEC coding for mobile broadcast service, the invention also provides a method of the outer FEC coding for mobile broadcast services. FIG. 3 illustrates an embodiment of the outer FEC coding method. In certain embodiments, the method can include the following operations:

Step S1: source information coding including, e.g., performing image encoding such as per 264 or AVS standard, or speech encoding such as per ACC plus standard for the mobile broadcast TV service;

Step S2: outer FEC coding including, e.g., performing Reed-Solomon encoding of the information package for error correcting. For example, the Reed-Solomon (204, 188, t=8) code is shortened from the Reed-Solomon (255, 239, t=8) code, in other words, transmission information package containing 188 bytes is encoded in the Reed-Solomon (204, 188, t=8) encoder to 204 bytes encoded information package, where at most 8 bytes error can be corrected. The code generating polynomial of the RS (255,239,t=8) is illustrated as $g(x)=(x+q^0)(x+q^1)(x+q^2) \ldots (x+q^{16})$, wherein q=2; the Galois field (GF) generating polynomial $p(x)=x^8+x^3+x^2+1$.

Step S3: outer interleaving including, e.g., performing interleaving of the RS encoded data to randomize the error bytes. The convolutional interleaving randomizes the coded data for correcting error bytes and recovering the correct data. Referred to FIG. 2, the convolutional interleaving and de-interleaving are implemented by several branches of first-in-first-out registers.

Step S4: transport channel multiplexing including, e.g., performing RS coding, interleaving, and mapping to physical channel to transmit. The two examples of the transport channel multiplexing are the same as illustrated as in transport channel multiplexing unit 108 shown in FIG. 1.

From the foregoing, it will be appreciated that specific embodiments of the invention have been described herein for purposes of illustration, but that various modifications may be made without deviating from the invention. Many of the elements of one embodiment may be combined with other embodiments in addition or in lieu of the elements of the other embodiments. Accordingly, the invention is not limited except as by the appended claims.

We claim:

1. An outer Forward Error Correcting (FEC) coding apparatus for a mobile broadcast service based on TD-SCDMA network, including:
a source information coding unit configured to encode image or speech into an information package for the mobile broadcast service;
an outer FEC coding unit connected to the source information coding unit and configured to perform Reed-Solomon (RS) encoding of the information package for error correcting;
an outer interleaving unit connected to the outer FEC coding unit and configured to perform interleaving of the RS encoded information package such that continuous error bytes are randomized; and
a transport channel multiplexing unit connected to the outer interleaving unit and configured to perform transport channel data multiplexing and mapping to a physical channel,
wherein parameters of the transport channel unit is set to:
a transport block size: 408 bits;
a transport block number: 5, 6, 7 or 8;
TFCI index: 0→5×408, 1→6×408, 2→6×408, 3→8×408;
CRC check: 16 bits;
channel coding type: ⅓ turbo encoding;
physical channel resource: one timeslot and 16 radio units (RUs) in the timeslot;
puncture limit: 55%;
TTI: 20 ms.

2. An outer Forward Error Correcting (FEC) coding apparatus for a mobile broadcast service based on TD-SCDMA network, including:
a source information coding unit configured to encode image or speech into an information package for the mobile broadcast service;

an outer FEC coding unit connected to the source information coding unit and configured to perform Reed-Solomon (RS) encoding of the information package for error correcting;
an outer interleaving unit connected to the outer FEC coding unit and configured to perform interleaving of the RS encoded information package such that continuous error bytes are randomized; and
a transport channel multiplexing unit connected to the outer interleaving unit and configured to perform transport channel data multiplexing and mapping to a physical channel,
wherein parameters of the transport channel unit is set to:
a transport block size: 204 bits;
a transport block number: 10, 11, 12, 13, 14, 15 or 16;
TFCI index: 0→10×204, 1→11×204, 2→12×204, 3→13×204, 4→14×204, 5→15×204, 6→16×204;
CRC check: 0 bits;
channel coding type: ⅓ turbo encoding;
physical channel resource: one timeslot, and 16 radio units (RUs) in the timeslot;
puncture limit: 55%;
TTI: 80 ms.

3. An outer Forward Error Correcting (FEC) coding method for a mobile broadcast service based on TD-SCDMA network, including:
coding source information including encoding of image or speech into an information package for the mobile broadcast service;
performing outer FEC coding including performing Reed-Solomon encoding of the information package for error correcting;
performing outer interleaving including performing interleaving of the RS encoded information package such that continuous error bytes are randomized; and
performing transport channel multiplexing including performing transport channel data multiplexing and mapping to a physical channel,
wherein parameters of the transport channel unit are set to:
a transport block size: 408 bits;
a transport block number: 5, 6, 7 or 8;
TFCI index: 0→5×408, 1→6×408, 2→6×408, 3→8×408;
CRC check: 16 bits;
channel coding type: ⅓ turbo encoding;
physical channel resource: one timeslot and 16 radio units (RUs) in the timeslot;
puncture limit: 55%;
TTI: 20 ms.

4. An outer Forward Error Correcting (FEC) coding method for a mobile broadcast service based on TD-SCDMA network, including:
coding source information including encoding of image or speech into an information package for the mobile broadcast service;
performing outer FEC coding including performing Reed-Solomon encoding of the information package for error correcting;
performing outer interleaving including performing interleaving of the RS encoded information package such that continuous error bytes are randomized; and
performing transport channel multiplexing including performing transport channel data multiplexing and mapping to a physical channel,
wherein parameters of the transport channel unit are set to:
the transport block size: 204 bits;
the transport block number: 10, 11, 12, 13, 14, 15 or 16;
TFCI index: 0→10×204, 1→11×204, 2→12×204, 3→13×204, 4→14×204, 5→15×204, 6→16×204;
CRC check: 0 bits;
channel coding type: ⅓ turbo encoding, the same as specified in 3GPP;
physical channel resource: one timeslot, and 16 radio units (RUs) in the timeslot;
puncture limit: 55%;
TTI: 80 ms.

* * * * *